United States Patent
Gao (10) Patent No.: US 11,442,516 B1
(45) Date of Patent: Sep. 13, 2022

(54) DATA CENTER CONTROL HIERARCHY FOR NEURAL NETWORKS INTEGRATION

(71) Applicant: BAIDU USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/205,360

(22) Filed: Mar. 18, 2021

(51) Int. Cl.
| G06F 1/26 | (2006.01) |
| H05K 7/20 | (2006.01) |
| G05B 13/02 | (2006.01) |
| G06F 1/20 | (2006.01) |

(52) U.S. Cl.
CPC ............. *G06F 1/26* (2013.01); *G05B 13/027* (2013.01); *G06F 1/206* (2013.01); *H05K 7/20836* (2013.01)

(58) Field of Classification Search
CPC ......... G06F 1/26; G06F 1/206; G05B 13/027; H05K 7/20836
See application file for complete search history.

(56) References Cited

U.S. PATENT DOCUMENTS

| 8,180,494 | B2* | 5/2012 | Dawson | G05B 15/02 700/277 |
| 8,634,962 | B2* | 1/2014 | Federspiel | G05D 23/1928 700/300 |
| 9,454,200 | B2* | 9/2016 | Chadha | G06F 1/263 |
| 2009/0012633 | A1* | 1/2009 | Liu | H04L 67/12 700/90 |
| 2010/0076607 | A1* | 3/2010 | Ahmed | G06F 1/206 700/297 |
| 2014/0074444 | A1* | 3/2014 | Hamann | G06F 30/13 703/2 |

* cited by examiner

*Primary Examiner* — Chun Cao
(74) *Attorney, Agent, or Firm* — Womble Bond Dickinson (US) LLP (57) ABSTRACT

A data center system includes a load section having an array of electronic racks, a thermal management system, and a power flow optimizer. The power flow optimizer is configured to determine a load power requirement of the load section based on workload data of the electronic racks and thermal data of the thermal management system. The data center system further includes a resource section having a number of power sources to provide power to the load section. The resource section includes a resource controller to configure and select at least some of the power sources to provide power to the load section based on the load power requirement provided by the power flow optimizer. The power flow optimizer includes a power flow neural network (NN) model to predict, based on the thermal data and the load data, an amount of power that IT clusters and the thermal management system need.

20 Claims, 8 Drawing Sheets

DATA CENTER CONTROL HIERARCHY FOR NEURAL NETWORKS INTEGRATION

FIELD OF THE INVENTION

Embodiments of the present invention relate generally to data center systems. More particularly, embodiments of the invention relate to control architecture for data center systems.

BACKGROUND

Given the fast development of AI (artificial intelligence), big data, edge computing and so on, the requirement on data centers and IT (information technology) clusters is becoming more and more challenging. The challenge is not only the amount of the data center and the servers need to be deployed are dramatically increasing, but also the variations from different types of workload requirements. These requirements are the main driver for the data center fast development. However, the challenge requires the data centers to be able to accommodate the workload variations. Since the workload variations directly correlate to the IT server diversities, what is more challenging is that energy efficiency is always one of the requirements for data center and IT clusters. Energy efficiency is not only correlated to the power consumption and Opex, but more importantly fulfill environmental and power usage regulations.

Another challenge is that the control design for the data centers are complicated. Since there are completely different areas of control technologies based for different systems, and they are also closely coupled to each other during normal operations. It is important to joint them together organically.

AI and ML (machine learning) technologies will sooner or later become a key tool and technique for data centers and IT clusters. It will bring full impact on data centers, including design, building, deployment, and operation. It may bring multiple benefits to the data center intelligence control. The current challenge is that there is a tremendous amount of the data generated by the data center. It is expensive and time consuming to complete a model training and tuning for a cluster. Given the nature of the data center system, a well-trained model based on one cluster may work for this cluster well. However, it may not perform well in another cluster, or significantly retraining may need. It might be functioning for another cluster which are identical but coupled in different systems (e.g., cooling and power).

The conventional solution for designing data center control includes separate modules, such as control modules for cooling systems, control modules for power systems, control modules for IT, and maybe varies of modules for IT control. All these control modules may not fully integrate to achieve a joint design. The shortfall is that it is extremely complicated to integrated them organically and operated them as one complete system. Overall, the convention solution lacks scalability and technology reusability.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure are related to a control hierarchy design for data centers. First of all, the system design is introduced as well as the control flow. In this part a high-level description of the main components in the system is provided, including the electrical, mechanical and IT components and the interconnection and interconnection among them in the whole system. Then the control flow is introduced to present the overall system management. There are three levels in the system, which are load level, source level, and intermediate level. In the second part, the design and control flow of each level is introduced to provide a detailed view of the levels. The input/output is given to show the control logic in each level. This aims to provide decoupled design on the control while still keeping the overall system jointed as an organic one. An optimizer is used in combination with each control for assisting implementing the AI/ML models. Detailed control location and function, as well as operation design for different levels are introduced.

According to some embodiments, a data center system includes a load section having an array of electronic racks, a thermal management system, and a power flow optimizer. Each of the electronic racks includes a stack of servers and each server contains one or more electronic devices. The thermal management system is configured to provide cooling and/or heating to the electronic devices. The power flow optimizer is configured to determine a load power requirement of the load section based on thermal data of the thermal management system and load data of the electronic racks. The data center system further includes a resource section having a number of power sources to provide power to the load section. The resource section includes a resource controller to configure and select at least some of the power sources to provide power to the load section based on the load power requirement provided by the power flow optimizer. The power flow optimizer includes a power flow neural network (NN) model to predict, based on the thermal data and the load data, an amount of power that the electronic racks and the thermal management system (the corresponding load side) need in order to satisfy a thermal requirement and data processing load requirement of the load section.

In one embodiment, the date center system further includes an intermediate section coupled between the resource section and the load section, where the intermediate section includes a power bus to distribute power from the resource section to the load section and other subsystems. The intermediate section further includes a subsystem load detector coupled to the other subsystems to determine a subsystem power requirement and a central controller coupled to the power flow optimizer of the load section and the subsystem load detector to determine a total power requirement based on the subsystem power requirement and the load power requirement. The total power requirement is utilized by the resource controller to configure and select at least some of the power sources.

In one embodiment, the load section further comprises one or more temperature sensors disposed within each server to measure temperatures of the electronic devices and a workload detector configured to determine a workload of each of the servers. The power flow NN model is to infer the load power requirement based on the temperatures and the workload of each of the servers. The load section further comprises a power dispatch controller coupled to the power flow controller to proportionally distribute the power received from the resource section to the thermal management system and the servers based on the load power requirement received from the power flow controller.

In one embodiment, the load power requirement includes information regarding how to dispatch the power to the thermal management system and the servers. The power dispatch controller is configured to output total power needed by the load section to the central controller. The resource section comprises a resource optimizer to receive the power requirement from the central controller to generate power source configuration information. The resource controller is configured to configure the power sources based on the power source configuration information. In one embodiment, the power optimization on the load side, which includes a NN model, may be developed to achieve an optimized computing efficiency.

In one embodiment, the resource optimizer comprises an NN model to determine the power source configuration information based on the total power needed. The power source configuration information includes information specifying an amount of power to be provided by each of the plurality of power sources. The power sources include a utility power source, a photovoltaic (PV) power source, and a battery power source. The central controller includes an NN model to infer the total power needed based on the load power requirement and the subsystem power requirement. The data center system of claim 1, wherein the data center system is a first data center subsystem of a plurality of data center subsystems. The power bus of the intermediate section is coupled to a power bus of an intermediate section of a second data center subsystem of the data center subsystems.

In one embodiment, the central controller is shared by the first data center subsystem and the second data center subsystem. The data center subsystems are part of a first data center cluster of the data center clusters. Each of the data center clusters is controlled by a respective cluster controller, and wherein the central controller is shared by the plurality of data center clusters.

Figure 1:
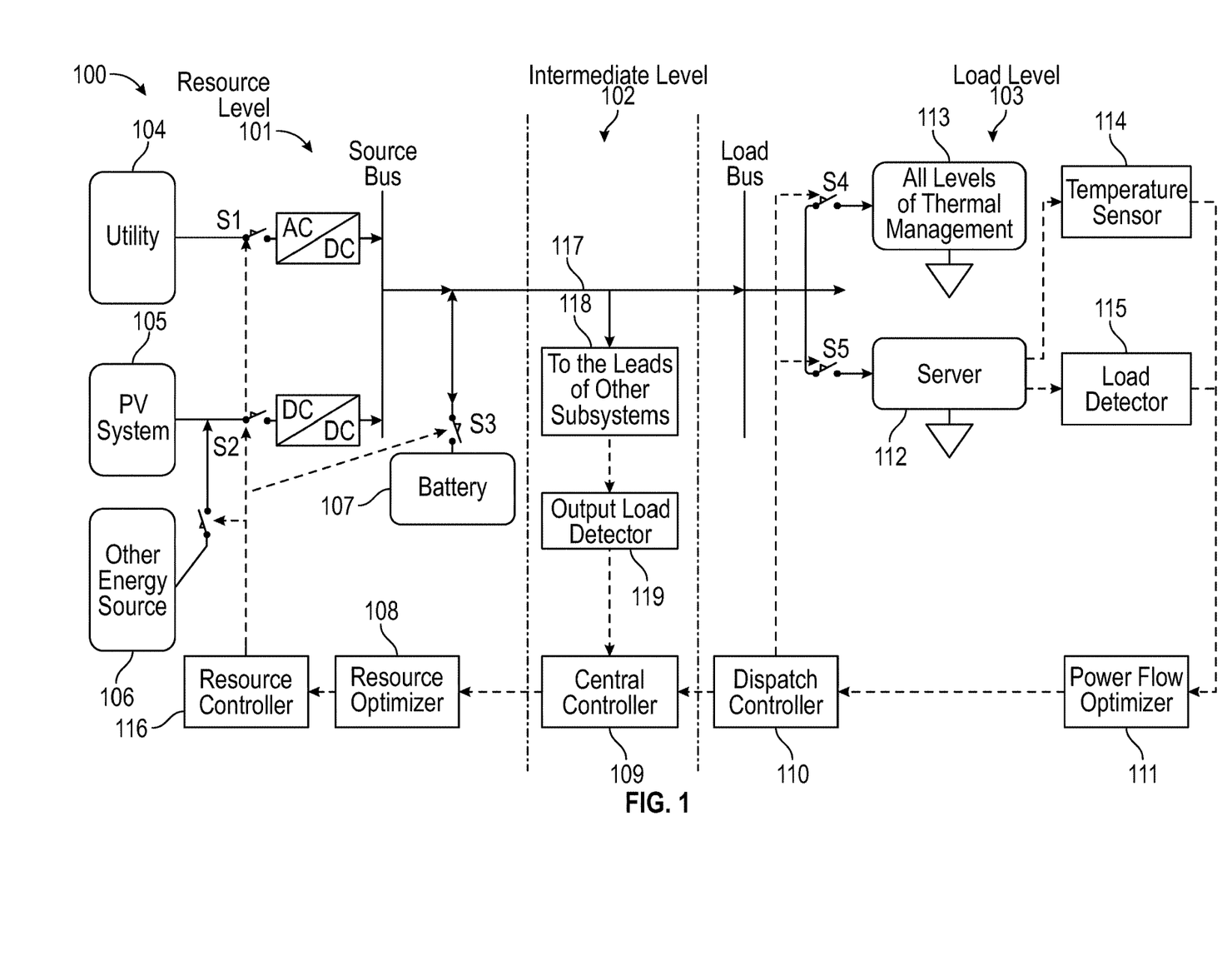
FIG. 1 is a block diagram illustrating an overall architecture of a data center system according to one embodiment.

FIG. 1 is a block diagram illustrating an overall architecture of a data center system according to one embodiment. Referring to FIG. 1, data center configuration or architecture 100 may represent any of data centers, where a data center may include one or more arrays of electronic racks. Each electronic rack include one or more server chassis arranged in a stack. Each server chassis includes one or more servers operating therein. Each server may include one or more processors, a memory, a storage device, and a network interface, etc., collectively referred to as IT components. In addition, a data center may further include a thermal management system to provide cooling to the IT components that generate heat during operations. Data center cooling may include liquid cooling and/or air cooling.

In one embodiment, data center architecture 100 includes a resource section or level 101, an intermediate section or level 102, and a load section or level 103. Load level 103 includes IT load 112 and thermal management system 113. IT load 112 may represent one or more electronic racks, each containing one or more servers therein. Thermal management system 113 may provide liquid cooling and/or air cooling to the IT components of the servers. In one embodiment, some of the IT components (e.g., processors) may be attached to a cold plate for liquid cooling and/or attached to a heatsink for air cooling. In addition, load level 103 further includes one or more temperature sensors 114 to measure the temperatures at different locations within the load level (e.g., surface of IT components, cooling liquid temperature, ambient temperature, etc.). Load level 103 further includes a load detector 115 to determine or detect the workload of load 112, which may be proportional to the power consumption of the load 112.

The load level 103 includes the IT load 112 as well as all levels of the thermal management 113 from internal of the servers such as cold plates, TEC (thermoelectric cooling), to the full system level. In this level, the key connection is the temperature, which is measured by one or more temperature sensors 114. This means the temperature is used for connecting the overall system between the IT and cooling. However, another key input in this level is the workload, which may be determined or detected by load detector 115. Therefore, the workload is also used in designing this level of control. The temperature is considered as a dependent factor of the load however, it is also strongly correlated to the thermal system. In one embodiment, the load detector 115 is connected to switching logic disposed on servers and/or electronic racks (e.g., motherboards) to determine the workload and traffic through the network interface. In one embodiment, the load detector 115 is connected to the individual BMC (board management controller) of the server chassis to determine the workload of various components, such as processor usages, etc. In some architectures, there is a load balancing server or resource manager to dispatch workload to individual servers, then the load detector 115 can receive information concerning the distributed workload from these components.

Furthermore, load level 103 includes a power flow optimizer 111, which may be implemented as a processor, a micro controller, an FPGA (field programmable gate array), or an ASIC (application specific integrated circuit). The power flow optimizer 111 is configured to determine the load power requirement for the load level 103 based on the thermal data (e.g., temperature) provided by temperature sensors 114 and load data provided by load detector 115. In one embodiment, power flow optimizer 111 includes a machine-learning model such as a neural network (NN) model to predict or determine the load power requirement based on the temperature data and the load data. The load power requirement represents an amount of power that load 112 and the thermal management system 113 need in order to satisfy the thermal requirement (e.g., operating below a predetermined temperature) and data processing load requirement of load 112. The NN model may be trained using a large amount of thermal data and load data of a variety of loads at different points in time. The NN model is configured to infer the load power requirement based on the temperature data and the workload of the servers. In one embodiment, the optimized power requirement produced by power flow optimizer 111 includes the optimized power requirement of each of the individual server (i.e., at a server level) and/or the associated thermal management system.

In one embodiment, load level 103 (also referred to as level 0) further includes dispatch controller 110 to receive the load power requirement information from power flow optimizer 111. The power requirement information may include information concerning how to dispatch or distribute power to the load 112 and thermal system 113, where power is received from resource level 101 via intermediate level 102, which will be described in details further below. Dispatch controller 110 may control or configure switching logic (e.g., S4, S5), as indicated by the dash lines, to control and distribute proper power to load 112 and thermal system 113 based on the load power requirement information provided by power flow optimizer 111. Dispatch controller 110 further provide load power requirement information to central controller 109 of intermediate level 102.

In load level 103, the temperature is used as a key parameter for the load and the thermal systems. The load detection performed by load detector 115 plays a significantly role. Load detector 115 (or power flow optimizer 111) intakes the actual workload and translates it to the actual power needed for the workload. In addition, in a more advanced architecture, the load detection provides an optimized workload distribution strategy as well. Since the load does not directly reflect the thermal system, therefore, temperature is used for connecting the load and the thermal systems. The temperature and load detection are used as input for the power flow optimizer 111. The NN model of power flow optimizer 111 only inputs these two parameters and generate an output representing the load power requirement.

The NN model may be trained using a set of training data. Once the training set of data are well converged such as temperature ranges and the load power ranges, the optimizer 111 can more accurately provide the power dispatch on this level such as the cooling power to thermal system 113 and the load power to load 112. Note that the load power to load 112 is different from the computing power, since the load power to the load 112 may be larger than the computing power due to the power loss and power leakage. The thermal management may impact on the difference, so that the corresponding required power to the thermal management system 113 varies. All these complicated strategies are realized by the NN model in the power flow optimizer 111. However, the only output for the dispatch controller is the total load power needed.

Figure 2:
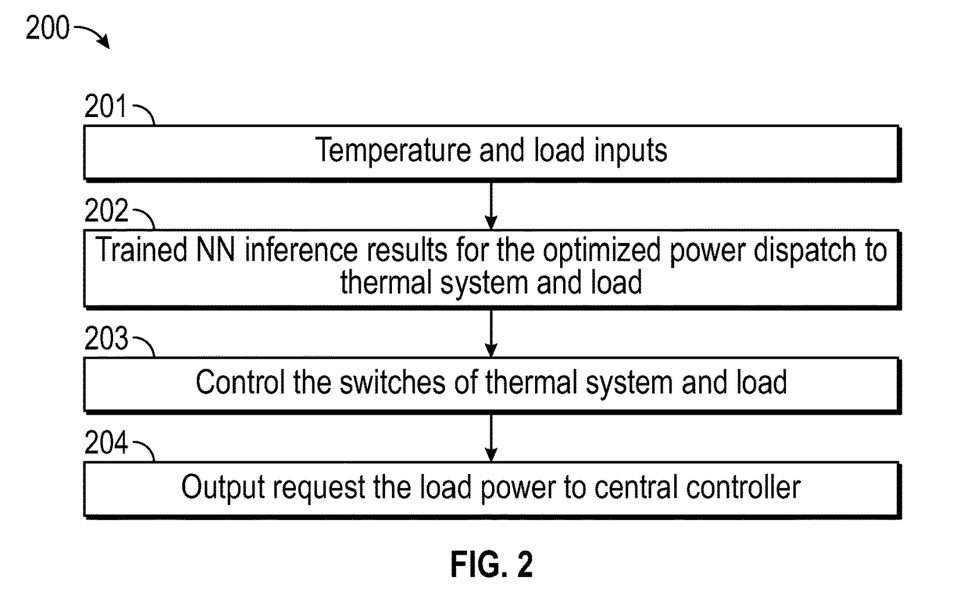
FIG. 2 is a flow diagram illustrating a process of a load section of a data center system according to one embodiment.

FIG. 2 is a flow diagram illustrating a process of a load section of a data center system according to one embodiment. Process 200 may be performed by load level 103 of FIG. 1. Referring to FIG. 2, at block 201, load detector 115 determine the workload of load 112 and may convert the load data into power requirement. In addition, temperature sensor 114 measure the temperature associated with load 112. At block 202, the temperature data and the load data are fed into an input of the NN model of power flow optimizer 111, which results in the optimized power requirement dispatch to the thermal system and the load. At block 203, in response to the load power requirement, dispatch controller 110 controls the switching logic to provide proper power to the thermal system and the load. Note that the term of "load power requirement" refers to the power requirement of load section or load level 103, including the power requirement of load 112 and thermal management system 113. At block 204, the dispatch controller 110 outputs a request the load power to central controller 109.

Referring back to FIG. 1, in one embodiment, resource section or resource level 101 includes a variety of power or energy sources, such as utility power source 104, photovoltaic (PV) power source 105, storage energy 107 (e.g., batteries), and other energy sources 106. Utility power source 104 provides alternating current (AC) power from a utility power grid (e.g., provided by a public utility company), which may be converted to direct current (DC) power using an AC-to-DC (AC/DC) converter. PV power source 105 may be a DC power source, which can be converted to a different DC power voltage using a DC-to-DC (DC/DC) converter. Storage power source 107 may be charged by any of power sources 104-106. When the power provided by power sources 104-106 is insufficient, storage power source 107 may be discharged to provide power to load section 103.

In one embodiment, resource level 101 includes resource controller 116 to configure and select at least some of the power sources 104-107 to provide power to the load level 103 based on at least the lower power requirement. Resource controller 116 controls the switching logic, as indicated by the dash lines, to configure and select the power sources.

In one embodiment, resource level 101 further includes a resource optimizer 108 to optimize and generate power source configuration information. The power source configuration information includes selection information for selecting at least some of the power sources 104-107. The power source configuration information is utilized by resource controller 116 to control the power sources 104-107. In one embodiment, resource optimizer 108 includes an NN model to determine the power source configuration information based on the total power required. The power source configuration information may include information indicating an amount of power to be provided by each of the power sources 104-107.

In the resource level 101, it is shown that this level mainly designed for the energy sources. It can be seen that there are several different types of sources including utility 104, PV source 105 as well as other energy sources 106. In addition, backup energy source or energy storage system 107 is used in this level. The resource controller 116 is used for controlling the switching logic (S1, S2, S3) for connecting the power to the main source bus. The resource optimizer 108 is used to provide dispatch strategy and communicated with the central controller 109. In one embodiment, resource optimizer 108 includes an NN model for optimizing the power source allocation based on the total power needed, as well as the existing power conditions and availabilities from each power sources. The only input fed to the resource optimizer 108 is the total power needed. All the other variations, which are the different power availabilities and conditions, are also input, but may not need to considered as variables.

At this level the only input from external is the total power needed. It can be an actual power in kW or kWh or a nondimensional value representing the power need. The resource optimizer 108 is integrated with AI/ML models to provide the most efficient inference on detailed power dispatch. The dispatch strategy is delivered to the resource controller 116 and the resource controller 116 manages the power input from utility, PV system, other renewable power source, battery and so on. Therefore, it can be seen that this level is highly decoupled from the others.

Since the total power is only input. This is a beneficial to the NN model since the variations of inputs are only total power, which can be easily covered by the training set of data. On the source side, since the power architecture is fixed in modules. This means even though there may be a power upgrade needed, the full power architecture can be doubled or tripled by adding one or two identical modules, respectively, which does not impact on the physical behavior of the module. Therefore, the optimizer model remains valid without too much NN training. On the hardware portion, the power dispatch strategy provided by the resource optimizer 108 is controlled by the resource controller 116 to connect the power sources to the main source bus.

Figure 3:
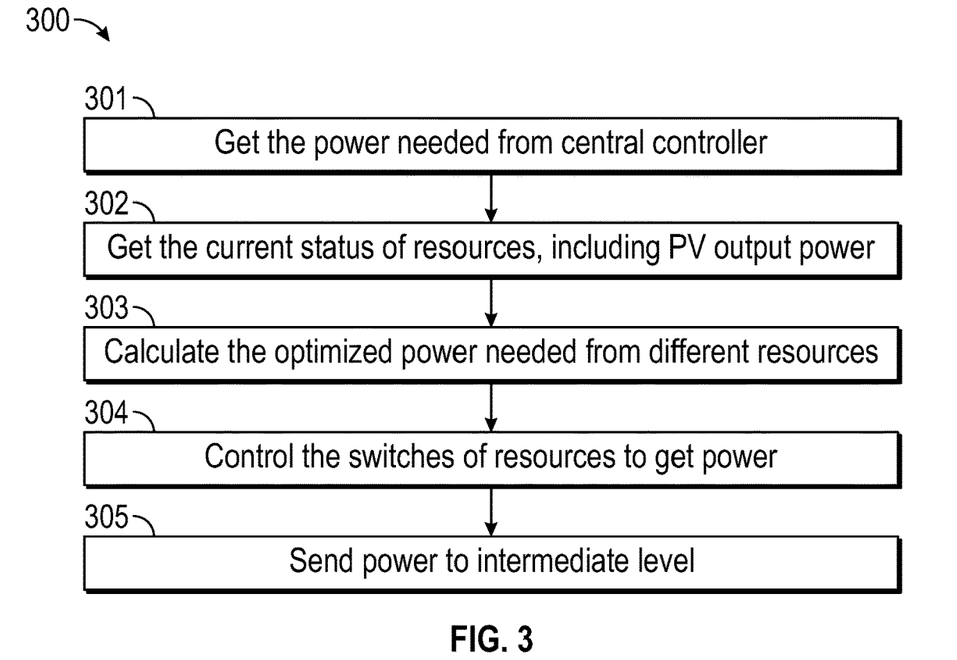
FIG. 3 is a flow diagram illustrating a process of managing power sources according to one embodiment.
Figure 6:
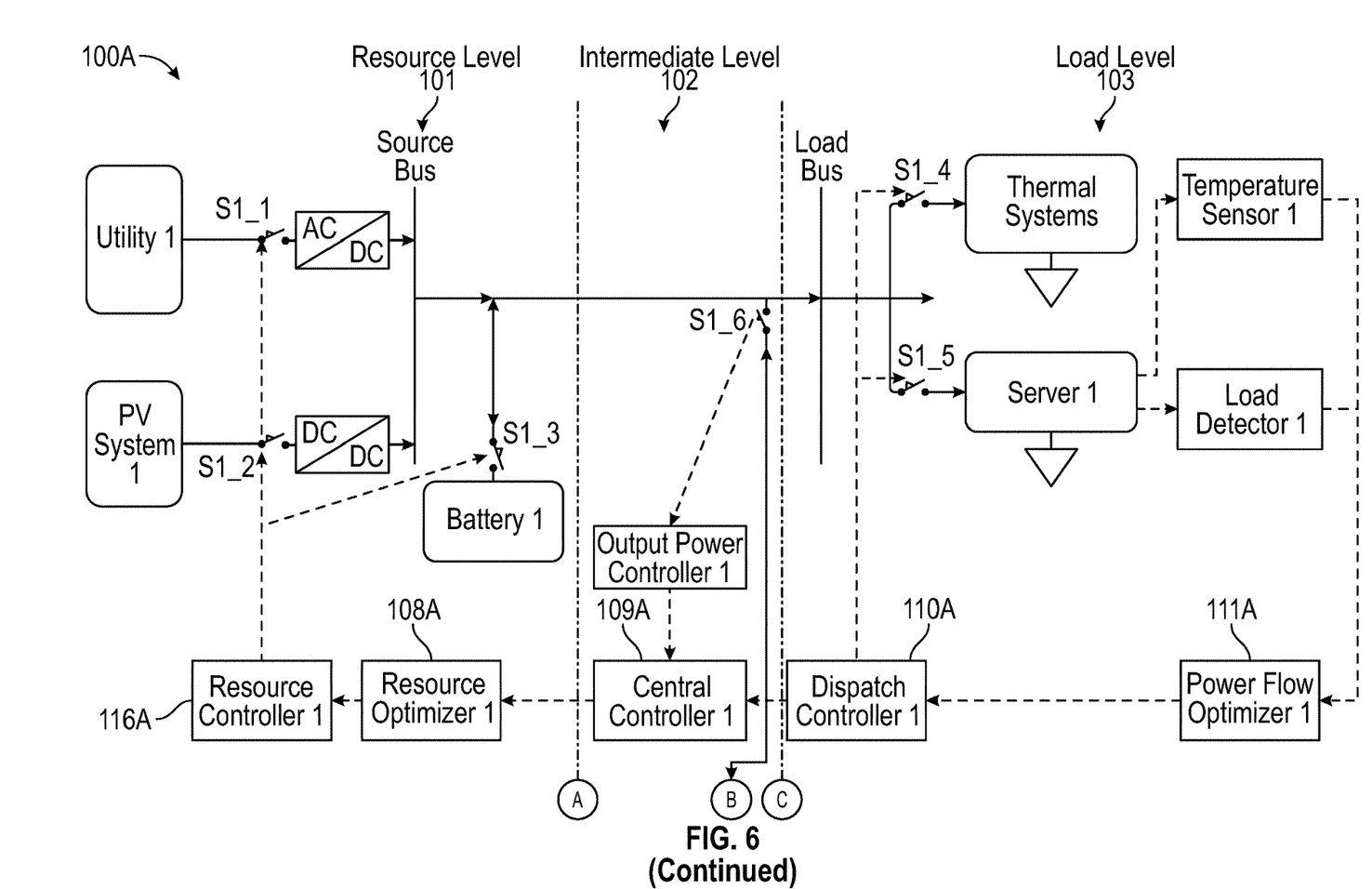
FIG. 6 shows a larger scale of the system with multiple sub-systems interconnected with each other according to one embodiment.

FIG. 3 is a flow diagram illustrating a process of managing power sources according to one embodiment. Process 300 may be performed by resource level 101 of FIG. 1. Referring to FIG. 3, at block 301, resource optimizer 108 receives the total power needed from central controller 109, where the total power needed represents the total power that will be consumed by load 112, thermal management system 113, and other subsystems 118. Subsystems 118 can include another set of load similar to load level 103, for example, as shown in FIG. 6. The intermediate level 102 will manage the power distribution to other subsystems. At block 302, the resource optimizer 108 determines the current status of the power sources 104-107, including which of the power sources are available and their respective capacity, etc. Note that at block 302, these are also as inputs to the optimizer, but they are not considered as the external variable inputs. Resource optimizer 108 may invoke resource controller 116 to retrieve or determine the status of the power sources. At block 303, resource optimizer 108 calculates the optimized power needed from different power sources 104-107. In one embodiment, resource optimizer 108 includes an NN model to determine the optimized power needed based on the total power needed and the status of the power sources 104-107. At block 304, resource controller 116 receives the optimized power needed from resource optimizer 108 and configures and selects at least some of the power sources 104-107 accordingly, which provides proper power to intermediate level 102 at block 305. Resource level 101 is also referred to as level 1.

Referring back to FIG. 1, in one embodiment, intermediate level 102 includes a power bus or interconnect 117 coupled between an output of resource level 101 and an input of load level 103 to transfer the power from resource level 101 to load level 103. In addition, power bus 117 also provide power to other subsystems 118 other than load 112 and thermal management system 113. Intermediate level 102 further includes a subsystem load detector 119 (also referred to as an output load detector) and a central controller 109. Subsystem load detector 119 is configured to determine the power consumption of the subsystem 118 based on their workload. Central controller 109 is coupled to subsystem load detector and dispatch controller 110 to receive the subsystem power requirement and the load power requirement of load level 103. In one embodiment, central controller 109 includes an NN model to infer the total power needed based on the power requirements provided by subsystem load detector 119 and dispatch controller 110.

The intermediate level 102 mainly includes the power bus which connects the output of the resource level 101 with the input of the load level 103. There is a load detector or inter-system resource dispatch detector is implemented. This is mainly for inter-system power dispatching requirement. The output load detector 119 used for providing the energy delivering to the load to the central controller 109. The central controller 109 is an independent controller which takes input from both the load level power requirement from dispatch controller 110 other sub-system/intersystem power requirement from output load detector 119, and sends the total power requirement to the resource level 101 and monitors the output power from the resource level 101. Central controller 109 is configured to determine the total power needed by the intermediate level 102 and load level 103. The intermediate level 102 is also referred to as level 2.

This level is above the resource and load levels which are level 0 and level 1. The central controller 109 intakes two power inputs from the intra-system controller (e.g., dispatch controller and power flow optimizer) or the intersystem power controller. There can be multiple of system 100 of FIG. 1 and they are interconnected. For example, a first subsystem is level 101 plus level 103, and a second subsystem is another set of level 101 plus level 103. A combination of these two subsystems is considered as an intersystem, and connected by the intermediate level 102. The intersystem controller receives power need from its own load level 103 and other subsystem's load level 103. In addition, the intersystem controller receives the power output from its resource level 101, which is provided by the Output load detector. It provides the total power needed to the level 1. This is under the circumstances that the current central controller 109 does not react to the power requirement from other subsystems 118. One key design here is that the central controller 109 may add the load requirement from the other subsystems 118 together and then delivered to the level 1 with an updated total power needed. Another NN model is integrated with central controller 119 since for inter-system power dispatching such as under the circumstances as power outage, power failure, or system service or maintenance.

Figure 4:
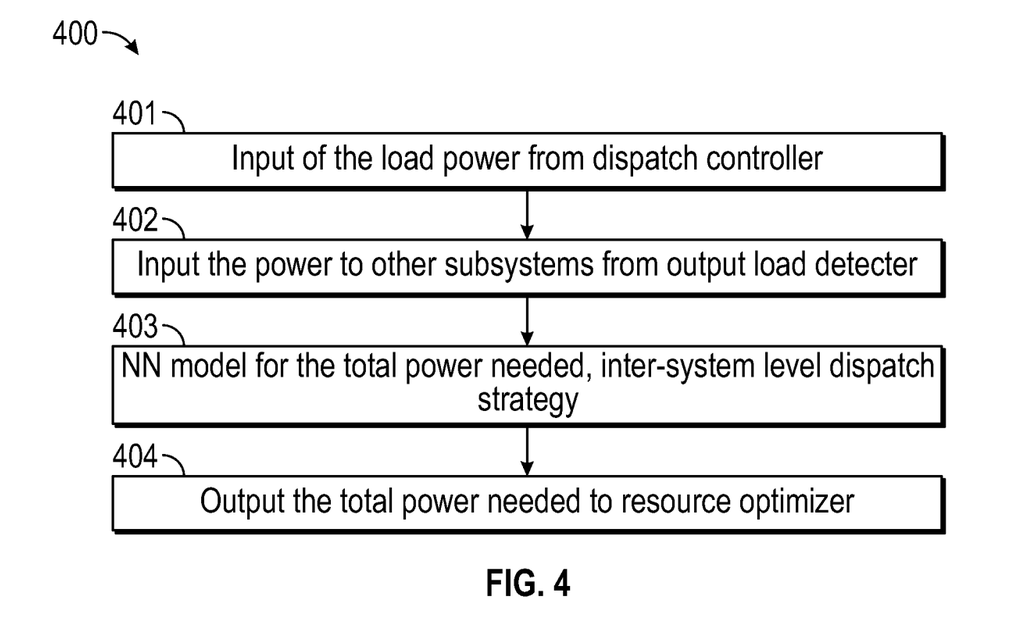
FIG. 4 is a flow diagram illustrating a process of operating an intermediate level according to one embodiment.

FIG. 4 is a flow diagram illustrating a process of operating an intermediate level according to one embodiment. Process 400 may be performed by intermediate level 102. Referring to FIG. 4, at block 401, central controller 109 receives the load power requirement from dispatch controller 110. At block 402, central controller 109 receives power requirement by the other subsystems from the output load detector 119. Output load detector 119 receives power requirement by the other subsystems, and output load detector 119 provides how much power is provided by the resource level 103. At block 403, the NN model of central controller 109 determines the total power needed and the inter-system level dispatch strategy. At block 404, central controller 109 outputs the total power needed to resource optimizer 108. For the intermediate level 102, it connects with each own source and power, but also it receives power needed from other subsystems.

Figure 5:
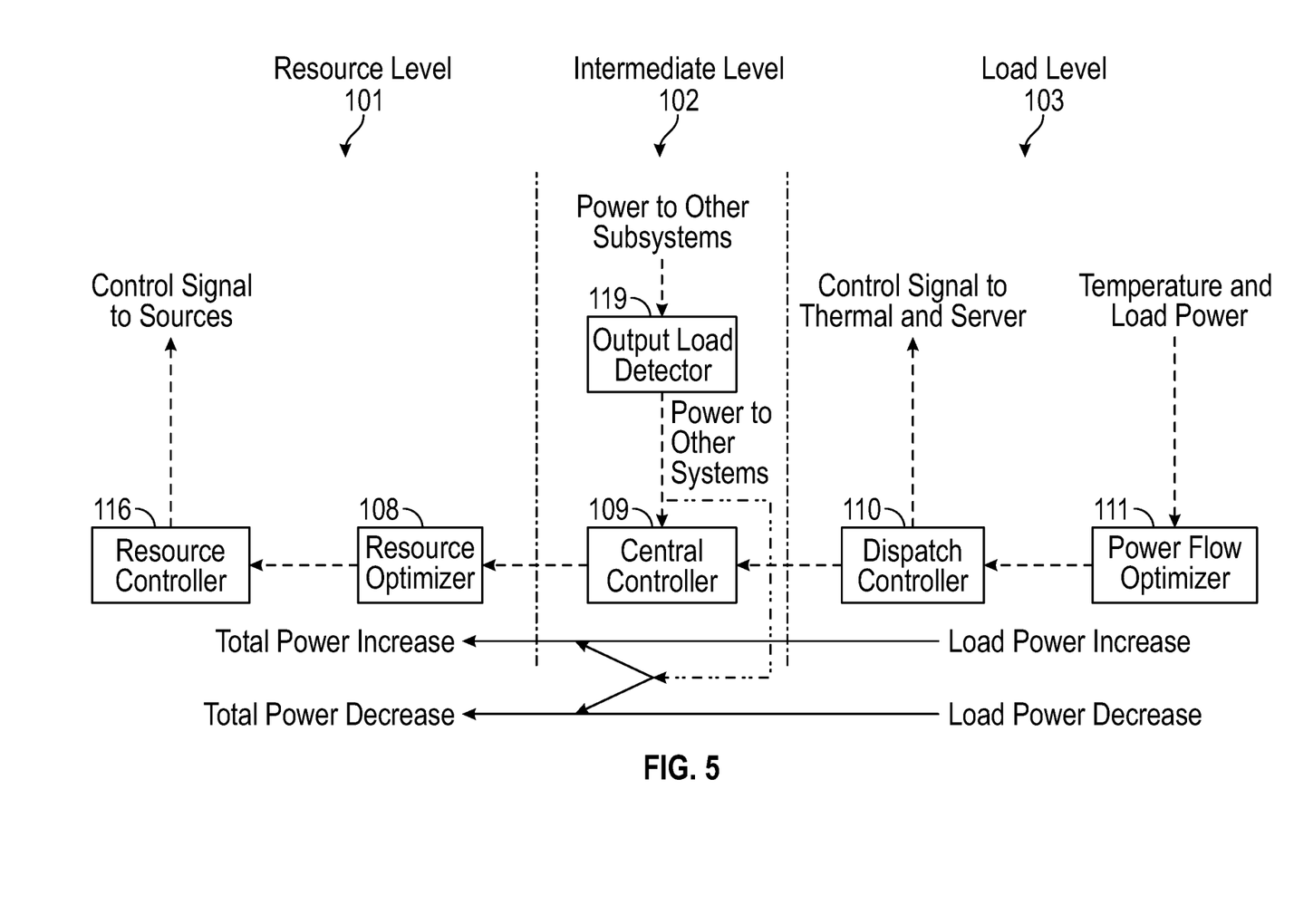
FIG. 5 shows the overall three levels control hierarchy design and operation method according to one embodiment.

FIG. 5 shows the overall three levels control hierarchy design and operation method according to one embodiment.

The key connection is the power or energy. The controllers are integrated with the optimizers, and the optimizers are embedded with NN models. The input and output of each controller are data representing power. The detailed power dispatch logic and principle do not impact among different levels. It can be seen that the variations of input in each layer is segregated among the layers and taken care within each layer. This is how the decoupling is being realized while the overall system is function as an organic unity. Note that each of controllers 108-111 and 116 may be implemented as a processor, microcontroller, an ASIC, or an FPGA, and each of them may include an NN model embedded therein.

In one embodiment, the data center system as shown in FIG. 1 is one of the data center subsystems in a cluster. FIG. 6 shows a larger scale of the system with multiple modules or it can be understood as multiple sub-systems interconnected with each other according to one embodiment. Referring to FIG. 6, the data center system includes a subsystem 100A and a subsystem 100B. Although there are only two subsystems shown, more subsystems may be implemented. Each of the subsystems 100A-100B may represent data center system 100 as shown in FIG. 1. Each of subsystems 100A-100B includes their respective controllers (108A-B, 109A-B, 110A-B, 111A-B, and 116A-B) as described above with respect to FIG. 1.

Each of the subsystems 100A-100B is identical as shown in FIG. 1. However, they are connected on the intermediate level 102 via an intersystem bus 150. This is why additional output power controller and power detector are used for each of the central controllers 109A-109B. In this example, central controllers 109A-109B are referred to as level 3 controllers. Even though there are inter-system power dispatching needed and required. It does not impact on the controllers or optimizers in level 0 (e.g., load level 103) and, especially level 1 (e.g., resource level 101). Since the only variation is the total power which already taken into account in the NN models in the optimizers, this is the benefit of the decoupling since there may be needed for future upgrading by adding more and more sub-systems to the intersystem bus 150. In some circumstances, each of the sub-systems may not be identical. Even though the systems are in heterogeneous, the individual optimizers still function properly. In one embodiment, the central controller 1 and the central controller 2 are level 2 controllers at the intermediate level 102. The output power controller 1 and output power controller 2 are level 3 controllers, which are used for communicating and intersystem power dispatch. This means that the output power controllers 1 and 2 only communicate with the central controllers.

Note that output power controllers 1 and 2 each may represent output load detector 119 of FIG. 1. Each power controller is configured to receive power and/or load requirement from another subsystem via intersystem bus 150. In addition, each power controller can also provide the power and/or load requirement of its own subsystem to another subsystem via intersystem bus 150. Thus in this example, output power controllers 1 and 2 communicate with each other within intermediate level 102. One subsystem may provide power to another subsystem via intersystem bus 150.

Figure 7:
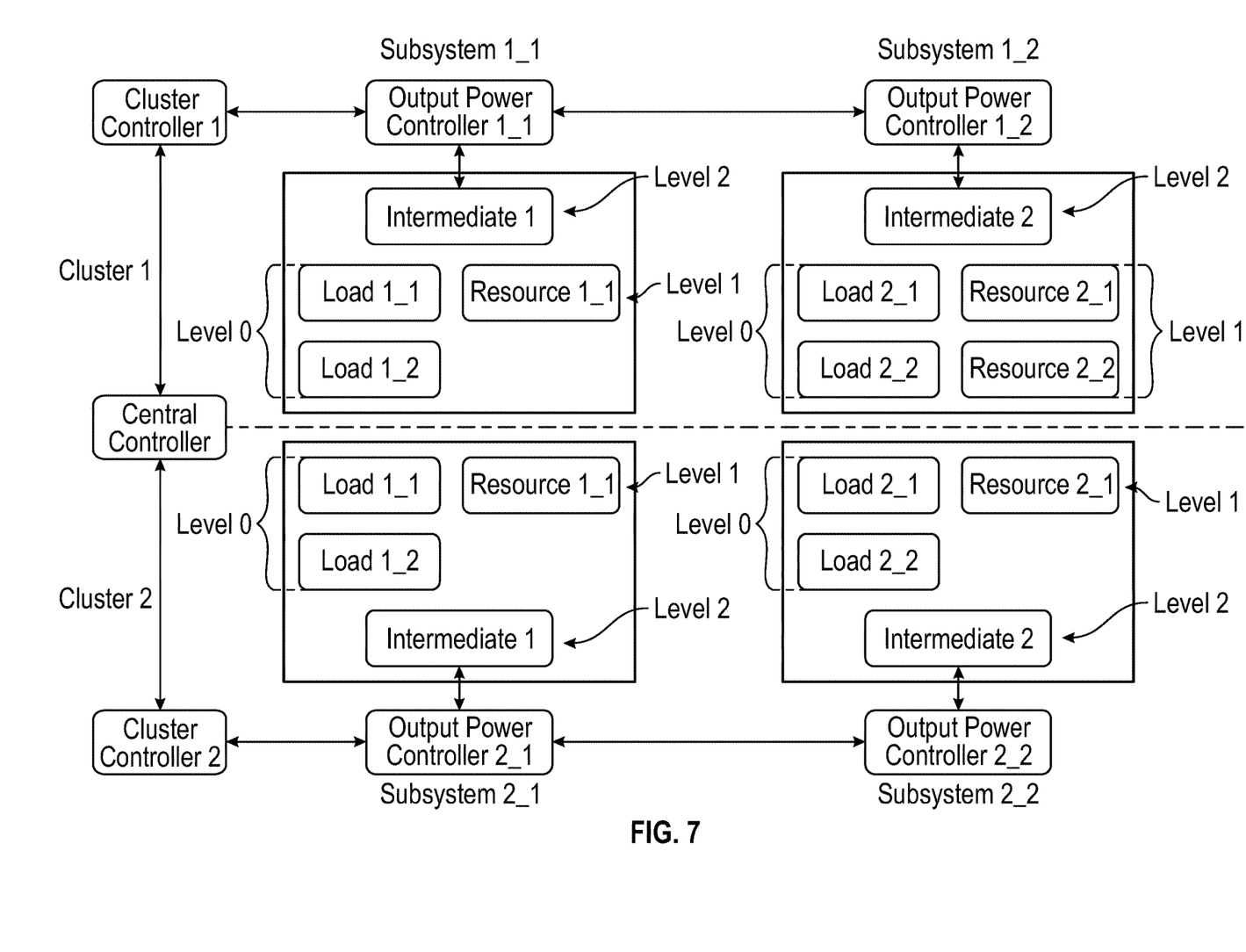
FIG. 7 is a block diagram illustrating a multi-cluster design of the power system according to one embodiment.

FIG. 7 is a block diagram illustrating a multi-cluster design of the power system according to one embodiment. Typically, a data center may be hosted in one or more data center campuses. Each campus may include one or more data center buildings. Each building may host one or more clusters. Each cluster may include one or more data center subsystems and each subsystem may include various modules or units. In each model, there is one or more level 0 and level 1. Level 0 and level 1 are connected through the level 2. Level 2 is designed for connecting level 1 and level 2. A cluster control is considered as a level 3 controller and the higher tier one—central controller as shown is a level 4 controller.

In this example as shown in FIG. 7, there are two clusters and each cluster includes two subsystems. As shown in each of the modules, the numbers of load or numbers of resources can be different and can be upgraded which does not impact on the any other systems. Even though within each module, the upgrading or variations in the level 1 and level 0 does not change the NN models in each of the optimizers since it is upgrade by repeating the identical infrastructures.

As an example, referring to FIG. 7, subsystem 1_1 maybe GPU clusters and subsystem 1_2 maybe general computing clusters. Any business model upgrading or business model variation will be only responded by the dedicated modules. As another example, if there is one more subsystem added to the cluster 1, even though a completely new subsystem 1_3 with new IT and power/cooling systems, it will have its own level 0 and level 1 optimizers and control within its module, and only connection is through the output controller 1_3. At cluster level—level 3 as well as level 2, the impact is minimal since they only communicate with the amount of power need and can be dispatched.

Therefore, the corresponding NN models in these layers may remain valid and no significant retraining needed. This design can be understood as a container based solution, which means that the corresponding control strategy and optimization NN are contained, so they can be reuse for system expanding and upgrading through the decoupling design. The control hierarchy enables the system variety and diversity. In addition, it is benefit to optimize the power efficiency, workload distribution design on different layers from modules to the entire campus.

Figure 8:
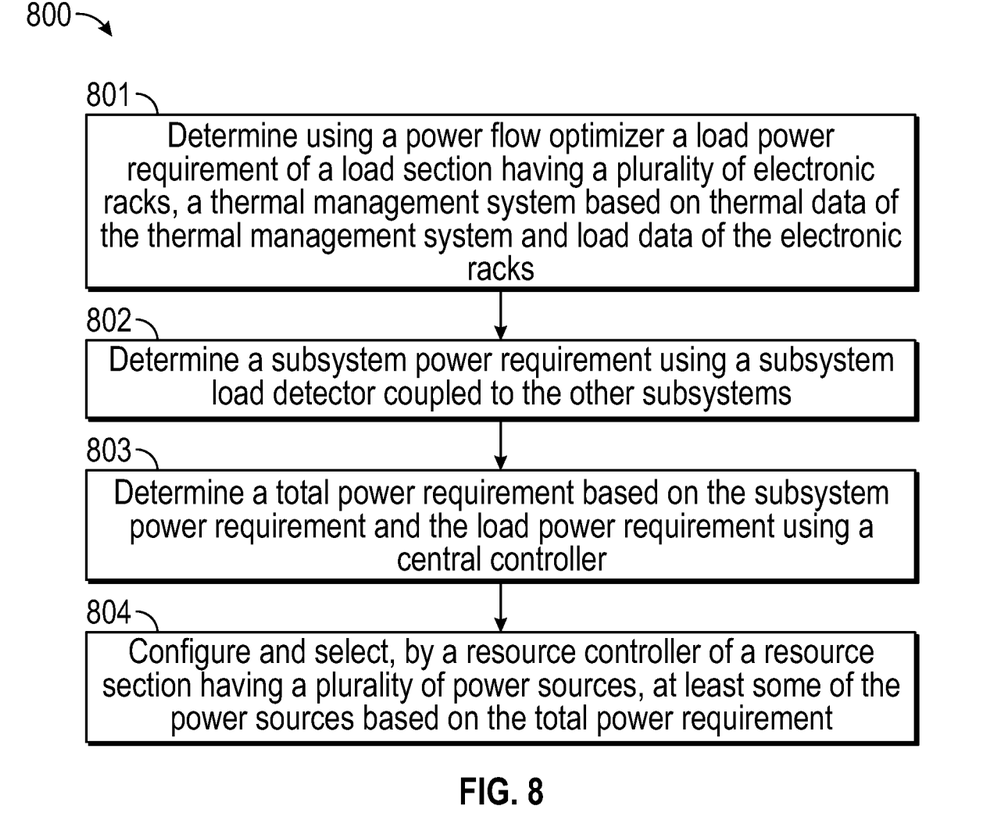
FIG. 8 is a flow diagram illustrating a process of managing power for a data center according to one embodiment.

FIG. 8 is a flow diagram illustrating a process of managing power for a data center according to one embodiment. Process 800 may be performed by processing logic which may include hardware, software, or a combination thereof. Referring to FIG. 8, at block 801, a power flow optimizer determines a load power requirement of a load section based on the thermal data of a thermal management system and load data of electronic racks as a load. At block 802, a subsystem load detector determines a subsystem power requirement of one or more subsystems. At block 803, a central controller of an intermediate section determines the total power needed based on the load power requirement and subsystem power requirement. At block 804, a source controller configures and selects at least some of the power sources based on the total power needed.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center system, comprising:
    a load section having a plurality of electronic racks, a thermal management system, and a power flow optimizer, wherein each of the electronic racks includes a plurality of servers and each server containing one or more electronic devices, wherein the thermal management system is configured to provide cooling and/or heating to the electronic devices, and wherein the power flow optimizer is configured to determine a load power requirement of the load section based on thermal data of the thermal management system and load data of the electronic racks; and a resource section having a plurality of power sources to provide power to the load section, wherein the resource section includes a resource controller to configure and select at least some of the power sources to provide power to the load section based on the load power requirement provided by the power flow optimizer, wherein the power flow optimizer includes a power flow neural network (NN) model to predict, based on the thermal data and the load data, an amount of power that the electronic racks and the thermal management system need in order to satisfy a thermal requirement and data processing load requirement of the load section.

2. The data center system of claim 1, further comprising an intermediate section coupled between the resource section and the load section, wherein the intermediate section includes a power bus to distribute power from the resource section to the load section and other subsystems.

3. The data center system of claim 2, wherein the intermediate section further comprises:
a subsystem load detector coupled to the other subsystems to determine a subsystem power requirement; and
a central controller coupled to the power flow optimizer of the load section and the subsystem load detector to determine a total power requirement based on the subsystem power requirement and the load power requirement, wherein the total power requirement is utilized by the resource controller to configure and select at least some of the power sources.

4. The data center system of claim 3, wherein the load section further comprises:
one or more temperature sensors disposed within each server to measure temperatures of the electronic devices; and
a workload detector configured to determine a workload of each of the servers, wherein the power flow NN model is to infer the load power requirement based on the temperatures and the workload of each of the servers.

5. The data center system of claim 4, wherein the load section further comprises a power dispatch controller coupled to a power flow controller to proportionally distribute the power received from the resource section to the thermal management system and the servers based on the load power requirement received from the power flow controller.

6. The data center system of claim 5, wherein the load power requirement includes information regarding how to dispatch the power to the thermal management system and the servers, and wherein the power dispatch controller is configured to output total power needed by the load section to the central controller.

7. The data center system of claim 3, wherein the resource section comprises a resource optimizer to receive the total power requirement from the central controller to generate power source configuration information, wherein the resource controller is configured to configure the power sources based on the power source configuration information.

8. The data center system of claim 7, wherein the resource optimizer comprises an NN model to determine the power source configuration information based on total power needed.

9. The data center system of claim 7, wherein the power source configuration information comprises information specifying an amount of power to be provided by each of the plurality of power sources.

10. The data center system of claim 7, wherein the plurality of power sources comprises a utility power source, a photovoltaic (PV) power source, and a battery power source.

11. The data center system of claim 3, wherein the central controller comprises an NN model to infer total power needed based on the load power requirement and the subsystem power requirement.

12. The data center system of claim 2, wherein the data center system is a first data center subsystem of a plurality of data center subsystems, and wherein a power bus of the intermediate section is coupled to a power bus of an intermediate section of a second data center subsystem of the plurality of data center subsystems.

13. The data center system of claim 12, wherein a central controller is shared by the first data center subsystem and the second data center subsystem.

14. The data center system of claim 12, wherein the plurality of data center subsystems is a first data center cluster of a plurality of data center clusters.

15. The data center system of claim 14, wherein each of the data center clusters is controlled by a respective cluster controller, and wherein a central controller is shared by the plurality of data center clusters.

16. A method for managing a data center system, the method comprising:
determining, using a power flow optimizer, a load power requirement of a load section having a plurality of electronic racks, a thermal management system based on thermal data of the thermal management system and load data of the electronic racks, wherein each of the electronic racks includes a plurality of servers and each server containing one or more electronic devices, wherein the thermal management system is configured to provide cooling and/or heating to the electronic devices; and
configuring and selecting, by a resource controller of a resource section having a plurality of power sources to provide power to the load section, at least some of the power sources to provide power to the load section based on the load power requirement provided by the power flow optimizer,
wherein the power flow optimizer includes a power flow neural network (NN) model to predict, based on the thermal data and the load data, an amount of power that the electronic racks and the thermal management system need in order to satisfy a thermal requirement and data processing load requirement of the load section.

17. The method of claim 16, wherein the data center system further comprises an intermediate section coupled between the resource section and the load section, wherein the intermediate section includes a power bus to distribute power from the resource section to the load section and other subsystems.

18. The method of claim 17, further comprising:
determining a subsystem power requirement using a subsystem load detector coupled to the other subsystems; and
determining a total power requirement based on the subsystem power requirement and the load power requirement using a central controller coupled to the power flow optimizer of the load section and the subsystem load detector, wherein the total power requirement is utilized by the resource controller to configure and select at least some of the power sources.

19. The method of claim 18, further comprising:

measuring temperatures of the electronic devices using one or more temperature sensors disposed within each server; and determining a workload of each of the servers using a workload detector, wherein the power flow NN model is to infer the load power requirement based on the temperatures and the workload of each of the servers.

20. The method of claim 19, further comprising proportionally distributing, using a power dispatch controller coupled to a power flow controller, the power received from the resource section to the thermal management system and the servers based on the load power requirement received from the power flow controller.

* * * * *